(12) United States Patent
Sainz (10) Patent No.: US 8,907,756 B2
(45) Date of Patent: Dec. 9, 2014

(54) SEMICONDUCTOR PACKAGE WITH AIR CORE INDUCTOR (ACI) HAVING A METAL-DENSITY LAYER UNIT OF FRACTAL GEOMETRY

(75) Inventor: Miguel Camarena Sainz, Tlaquepaque (MX)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 13/536,899

(22) Filed: Jun. 28, 2012

(65) Prior Publication Data

US 2014/0002223 A1 Jan. 2, 2014

(51) Int. Cl.
*H01F 5/00* (2006.01)
*H01F 27/28* (2006.01)

(52) U.S. Cl.
USPC .......................................... 336/200; 336/232

(58) Field of Classification Search
USPC ................................................. 336/200, 232
See application file for complete search history.

(56) References Cited

U.S. PATENT DOCUMENTS

| | | | |
|---|---|---|---|
| 2004/0227608 A1* | 11/2004 | Nakatani et al. | 336/173 |
| 2007/0262132 A1* | 11/2007 | Burton et al. | 235/375 |
| 2009/0201113 A1* | 8/2009 | Crawford et al. | 336/15 |
| 2009/0207087 A1* | 8/2009 | Fang et al. | 343/795 |
| 2010/0026368 A1* | 2/2010 | Tang et al. | 327/361 |
| 2010/0171200 A1* | 7/2010 | Lee et al. | 257/659 |
| 2010/0213590 A1* | 8/2010 | Warren et al. | 257/678 |
| 2011/0006959 A1* | 1/2011 | Menko et al. | 343/728 |

OTHER PUBLICATIONS

Lee, Thomas H., "The Design of CMOS Radio-Frequency Integrated Circuits," Cambridge University Press, Second Edition, hardcover, 1998, Figure 4.12, p. 125.
Lee, Thomas H., "The Design of CMOS Radio-Frequency Integrated Circuits," Cambridge University Press, Second Edition, hardcover, 1998, Figure 4.13, p. 126.
Stojanović, et al., "A New Fractal-Based Design of Stacked Integrated Transformers," Active and Passive Electronic Components, 2008, vol. 2008, Article ID 134805, 8 pgs.
Marić, et al., "Modelling and Characterisation of Fractal Based RF Inductors on Silicon Substrate," Devices and Microsystems, Oct. 12-16, 2008, 4 pgs.

* cited by examiner

*Primary Examiner* — Tsz Chan
(74) *Attorney, Agent, or Firm* — Blakely, Sokoloff, Taylor & Zafman LLP (57) ABSTRACT

Semiconductor packages with air core inductors (ACIs) having metal-density layer units of fractal geometry are described. In an example, an inductor structure includes a stack of metal loops. One or more input terminals is coupled to the stack of metal loops. One or more output terminals is coupled to the stack of metal loops. One or more metal-density layer units is disposed above and over the stack of metal loops. At least one of the metal-density layer units has a fractal geometry.

12 Claims, 8 Drawing Sheets

SEMICONDUCTOR PACKAGE WITH AIR CORE INDUCTOR (ACI) HAVING A METAL-DENSITY LAYER UNIT OF FRACTAL GEOMETRY

TECHNICAL FIELD

Embodiments of the invention are in the field of semiconductor packages and, in particular, semiconductor packages with air core inductors (ACIs) having metal-density layer units of fractal geometry.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. For example, some semiconductor packages now use a coreless substrate, which does not include the thick resin core layer commonly found in conventional substrates. Furthermore, the demand for higher performance devices results in a need for an improved semiconductor package that enables a thin packaging profile and low overall warpage compatible with subsequent assembly processing.

On the other hand, although scaling is typically viewed as a reduction in size, the addition of functionality in a given space is also considered. However, structural issues may arise when attempting to integrate semiconductor die with additional functionality also housed in the package. For example, the addition of packaged inductors may add functionality, but ever decreasing space availability in a semiconductor package may provide obstacles to adding such functionality.

DESCRIPTION OF THE EMBODIMENTS

Semiconductor packages with air core inductors (ACIs) having metal-density layer units of fractal geometry are described. In the following description, numerous specific details are set forth, such as packaging architectures, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to fractal-shaped package metal layers for reducing eddy currents in electrical package air-core inductors. Such inductors may be useful for, or impact, inductor-in-package design technologies, interconnect technologies, package design technologies, package manufacturing technologies, power delivery design technologies, etc. One or more embodiments of the present invention are directed to fractal-shaped package metal layers for reducing eddy currents within electrical packages that can mitigate the inductance of the electrical package air-core inductors. Embodiments described herein may be incorporated as embedded passive components in package designs for client and server silicon solutions. In an embodiment, inductor configurations described herein provide an approach for shape replacement solutions for mitigating the impact of eddy currents to the effective inductance of air-core inductors.

Air core inductors typically require large form semiconductor packages, and possibly cored packages. As scaling and die shrinking is performed with each generation, package scaling is often required to provide ever smaller form factors. However, the reduction in package size makes inclusion of ACIs difficult since a smaller package means a smaller inductor which can lead to increased losses for the ACIs. Nonetheless, power management is trending towards the use of integrated voltage regulators (IVRs) without a full understanding of the scalability of IVR components. In the near future, the package core area is expected to decrease by approximately 50% with each generation. Unfortunately, conventional ACIs may not scale by the same factor while maintaining the same performance. Predictions for IVRs performance based on ACIs show approximately 25-40% increase in inductor losses per generation.

More specifically, previous approaches for air-core inductors (ACIs) include fabricating package-embedded inductors in an electrical package housing one or more semiconductor dies. Such an approach typically involves the use of additional copper layers in the layout in order to avoid mechanical bending (e.g., potato-chipping) of the package structure. The copper layers may be density-metal layers that do not serve as electrical paths, but rather may yield issues by affecting the electrical performance of an ACI via eddy currents. For example, density-metal layers are typically placed directly above an ACI loop. Eddy currents may be induced in the density-metal layers by the magnetic field of the ACI, as described in greater detail below. A magnetic field opposed to the magnetic field of the ACI may be generated. This additional, and opposing, magnetic may degrade the inductance of the ACI. Previous attempts to mitigate such issues have included the use of sectioned planes, such as eight squared sections, described in greater detail below. In an embodiment, other types of geometric shapes are used to reduce even further the induced loop currents, such as a fractal shape, also described in greater detail below.

Figure 1A:
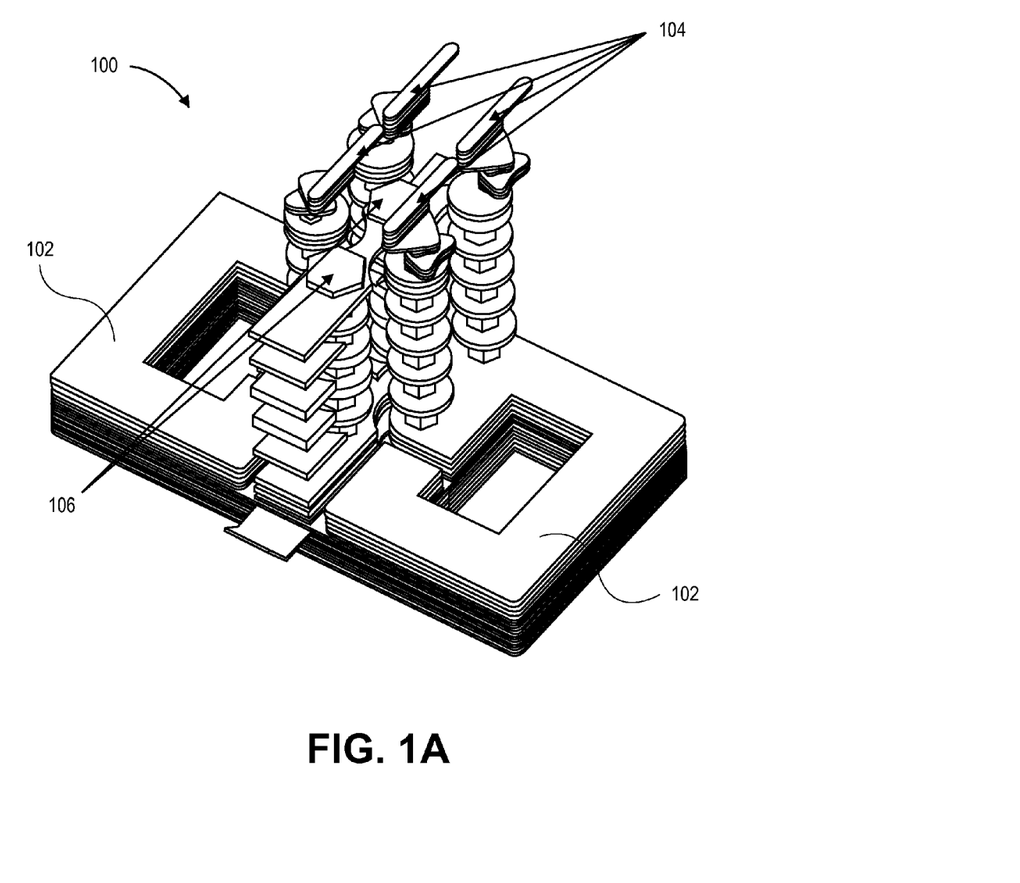
FIG. 1A illustrates an angled plan view of an air-core inductor for use in a semiconductor package.

As a baseline for providing a context for one or more embodiments of the present invention, FIG. 1A illustrates an angled plan view of an air-core inductor for use in a semiconductor package. Referring to FIG. 1A, an inductor structure 100 includes a plurality of vertically stacked metal loops 102. Inputs and outputs are also included, such as the four inputs 104 and two outputs 106 illustrated in FIG. 1A. The inductor structure 100 may be suitable for embedding in a semiconductor package. For example, one or more of the package layers may be used to fabricate the loops of the inductor structure 100. In one embodiment, no ferrite core is included with inductor structure 100, yielding inductor structure 100 an air-core inductor, as opposed to a magnetic core inductor. It is to be understood that ground layers or other neighboring power rails may also be included with inductor structure 100, but are not depicted in FIG. 1A. It is to be understood that inductor structure 100 may be viewed as a single air core inductor having two stacks of loops, or may be viewed as a combination of two inductors, each having one of the stack of loops.

Figure 1B:
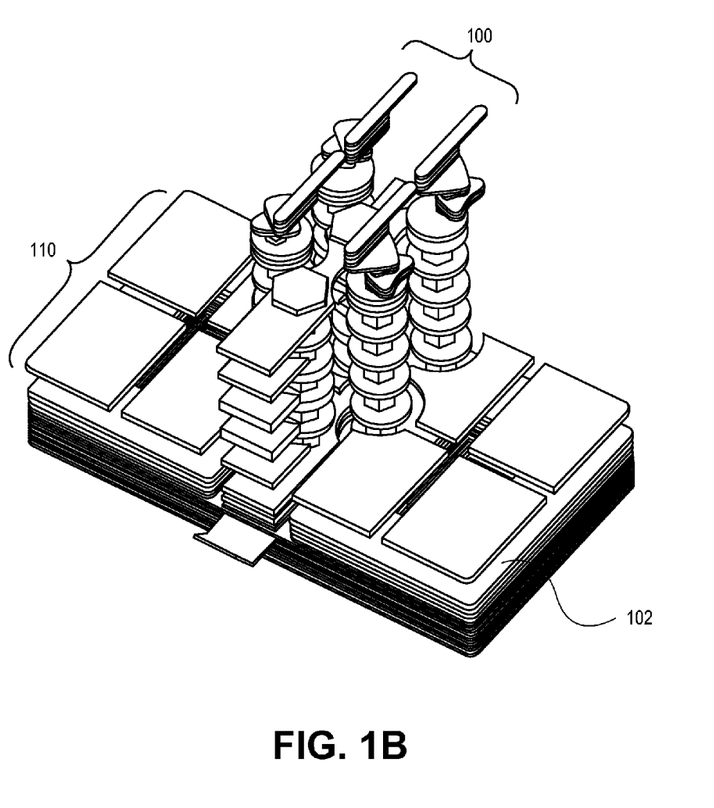
FIG. 1B illustrates an angled plan view of the air-core inductor of FIG. 1A, with a density metal layer now depicted.

FIG. 1B illustrates an angled plan view of the air-core inductor of FIG. 1A, with a density metal layer now depicted. Referring to FIG. 1B, a density metal layer 110 is included above and over the plurality of vertically stacked metal loops 102. In the particular example of FIG. 1B, eight density-metal layer units are disposed above the inductive loops 102. As also depicted in this particular example, the eight density-metal layer are essentially square in geometry, or portions thereof. Although improved over a single, larger metal unit, the arrangement depicted in FIG. 1B may still be susceptible to unwanted eddy current induction from the magnetic field generated by the inductor, as described in greater detail in association with FIG. 3A.

To address the issues described above, in an embodiment, a fractal shape is used as a geometric shape for a density-metal layer unit in an ACI in order to diminish induced eddy currents. For example, FIG. 2 illustrates a fractal geometry and its generation from a basic square geometry through a fractal rearrangement, in accordance with an embodiment of the present invention.

Figure 2:
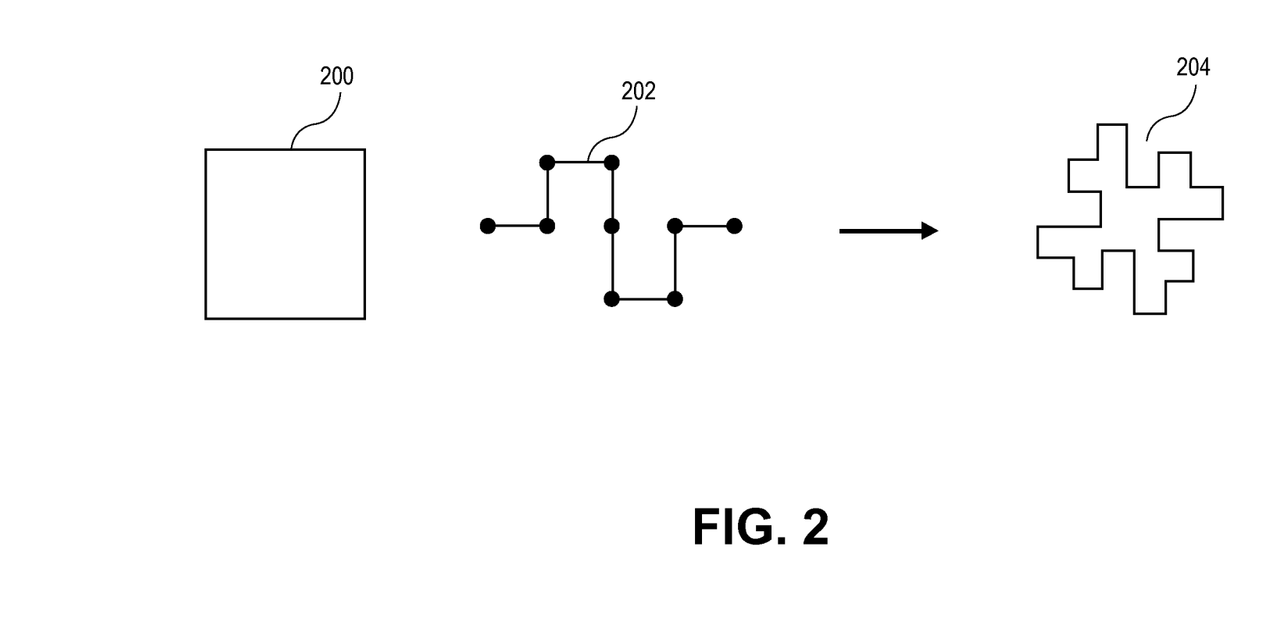
FIG. 2 illustrates a fractal geometry and its generation from a basic square geometry through a fractal rearrangement, in accordance with an embodiment of the present invention.

Referring to FIG. 2, a basic square geometry 200 is used as the starting curve. A curve segment 202 is generated from the basic square geometry 200 to generate a fractal geometry 204. In one embodiment, the fractal geometry 204 is a Koch Island fractal geometry, as depicted in FIG. 2. To generate the fractal geometry 204, each side of the original square geometry 200 is replaced by a scaled squared curve. Specifically, each of its segments of the square is replaced with a square-dented curve with segments that are scaled by a factor of one quarter (¼). Any suitable number of iterations may be used to arrive at a fractal geometry, however, the total number of iterations may be somewhat limited by manufacturing capabilities for the ultimate fractal pattern. For example, only one iteration was used to arrive at the specific geometry depicted for 204 in FIG. 2. In an embodiment, the fractal geometry is used for the geometry of density-metal layer units for a packaged air core inductor, as described in greater detail in association with FIG. 4B.

The geometry of the density-metal layer units of FIG. 1B provide sufficient area to allow for the formation of eddy currents. In that case, eight similar patterns are used in the ACI. In an embodiment, an advantage of a fractal shape geometry for one or more of the density-metal layer units, e.g., a geometry described in association with FIG. 2 is the diminishing of the formation of induced eddy currents loops within a given area. Such diminishing may enable reduction in a parasitic effect of the magnetic field from the eddy currents against the ACI magnetic field. To illustrate this concept, FIG. 3A illustrates eddy current formation for a square density-metal layer unit geometry, while FIG. 3B illustrates eddy current formation for a fractal-based density-metal layer unit geometry.

Figure 3A:
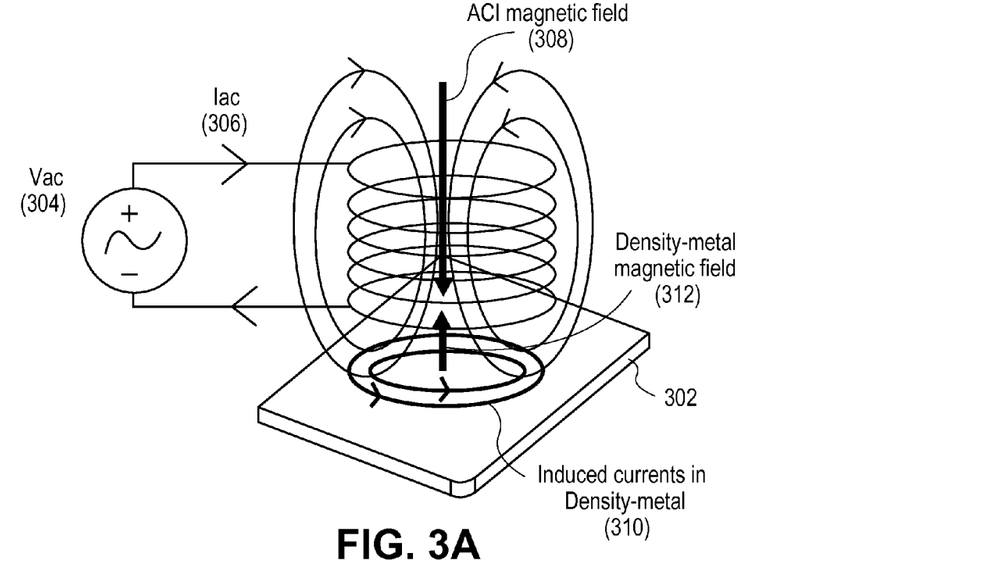
FIG. 3A illustrates eddy current formation for a square density-metal layer unit geometry.
Figure 3B:
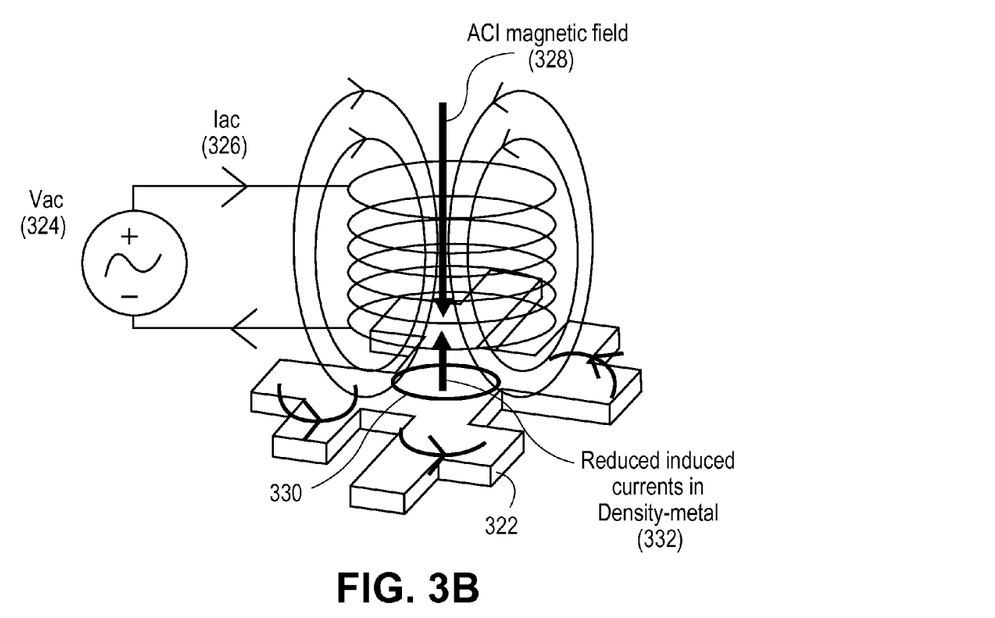
FIG. 3B illustrates eddy current formation for a fractal-based density-metal layer unit geometry, in accordance with an embodiment of the present invention.

Referring to FIGS. 3A and 3B, a qualitative comparison between a square shape (FIG. 3A) and a fractal shape (FIG. 3B) for a density-metal layer unit may be made by an inductance comparison produced by each shape. Referring to FIG. 3A, for a square geometry 302, an applied voltage 304 for, and resulting current 306 from, an air-core inductor provides an ACI magnetic field 308. Induced currents 310 in the density-metal layer unit with square geometry 302 generate a density magnetic field 312 that counters the ACI magnetic filed 308. Such countering of the ACI magnetic field 308 may be undesirable as performance of the ACI may be reduced.

In contrast, referring to FIG. 3B, for a fractal geometry 322, an applied voltage 324 for, and resulting current 326 from, an air-core inductor provides an ACI magnetic field 328. Induced currents 330 may still exist in the density-metal layer unit with fractal geometry 322, generating a density magnetic field 332 that counters the ACI magnetic filed 328. However, in an embodiment, the induced currents 330 of FIG. 3B are significantly reduced as compared with those for FIG. 3A and, thus, the countering of the ACI magnetic field 328 may be reduced or diminished as compared with the arrangement of FIG. 3A. Calculations for the induced currents in FIGS. 3A and 3B were obtained using a 3D-field solver. In one embodiment, the inductance of the ACI increased by 0.1-0.2 uH when the fractal shape was used. This may represent a significant increase in inductance since, in an embodiment, target inductances are approximately in the range of 1 uH to 5 uH.

Figure 4A:
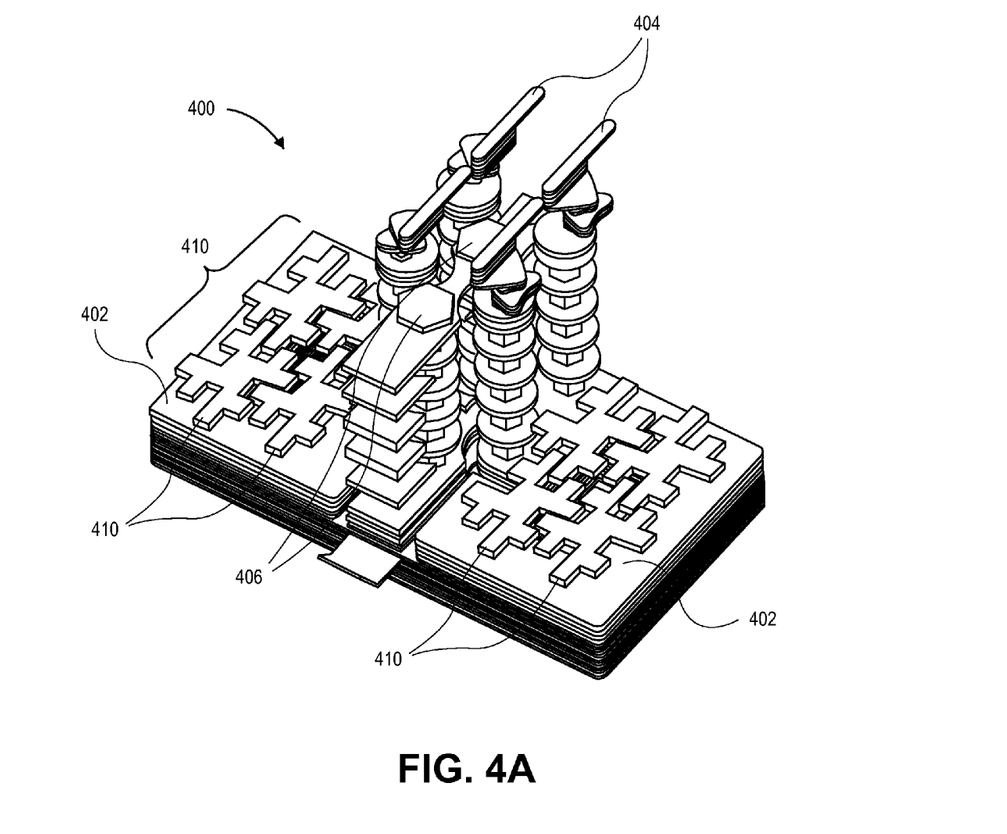
FIG. 4A illustrates an angled plan view of an air-core inductor having a density-metal layer unit of fractal geometry for use in a semiconductor package, in accordance with an embodiment of the present invention.

Thus, in an embodiment, density-metal layer units having a fractal geometry may be used to form an air core inductor. For example, FIG. 4A illustrates an angled plan view of an air-core inductor having a density-metal layer unit of fractal geometry for use in a semiconductor package, in accordance with an embodiment of the present invention. Referring to FIG. 4A, an inductor structure 400 includes a plurality of vertically stacked metal loops 402. Inputs and outputs are also included, such as the four inputs 404 and two outputs 406 illustrated in FIG. 4A. The inductor structure 400 may be suitable for embedding in a semiconductor package. For example, one or more of the package layers may be used to fabricate the loops of the inductor structure 400. In one embodiment, no ferrite core is included with inductor structure 400, yielding inductor structure 400 an air-core inductor, as opposed to a magnetic core inductor. It is to be understood that ground layers or other neighboring power rails may also be included with inductor structure 400, but are not depicted in FIG. 4A. It is to be understood that inductor structure 400 may be viewed as a single air core inductor having two stacks of loops, or may be viewed as a combination of two inductors, each having one of the stack of loops. Referring again to FIG. 4A, a density metal layer 410 is included above and over the plurality of vertically stacked metal loops 402. In the particular example of FIG. 4A, eight fractal density-metal layer units are disposed above the inductive loops 402. In a specific embodiment, the fractal geometry of each unit is based on a Koch Island fractal geometry with one iteration from a staring square geometry. However, other embodiments include fractal geometries based on further iterations of the fractal approach. While such further iterations may be used to further reduce the intensity of the induced currents, manufacturing limits and metal density targets may need to be taken into account when determining a number of iterations to perform.

Figure 4B:
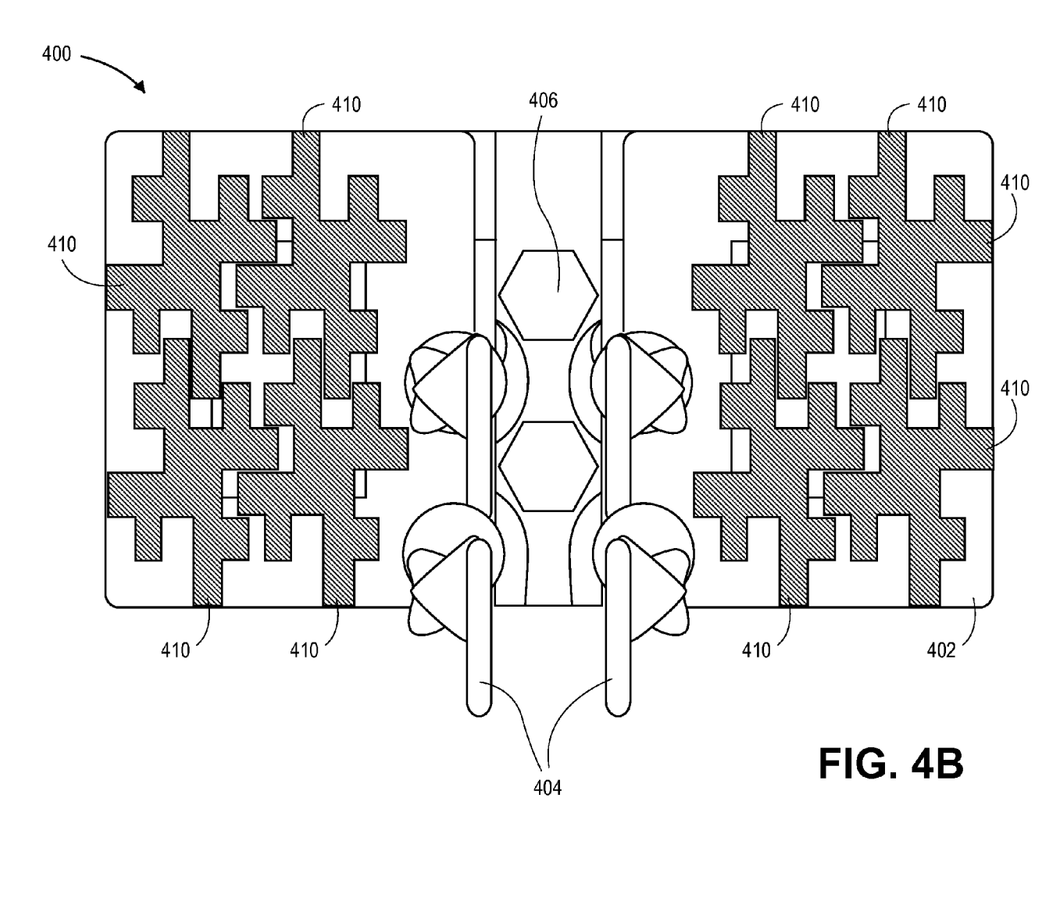
FIG. 4B illustrates a top-down plan view of the inductor structure of FIG. 4A.

FIG. 4B illustrates a top-down plan view of the inductor structure of FIG. 4A. A 2 mm scale is also depicted to demonstrate, in an embodiment, a possible scale size for the inductor structure 400. As an example, the length of the entire ACI design may be approximately 3 mm, while the width may be approximately 1.5 mm. Referring to FIG. 4B, in an embodiment, the density-metal layer units of fractal geometry 410 do not contact one another. In one embodiment, eight units are provided above two stacked loops 402 of the inductor structure 400, as depicted in FIGS. 4A and 4B. In a specific such embodiment, such a grouping achieves metal density targets. It is to be understood that any combination of numbers of fractal shaped units and corresponding loops may be used and considered within the spirit and scope of embodiments of the present invention. Also, in alternative embodiments, fractal geometries may be used in combination of square or other regular geometric units.

Figure 5:
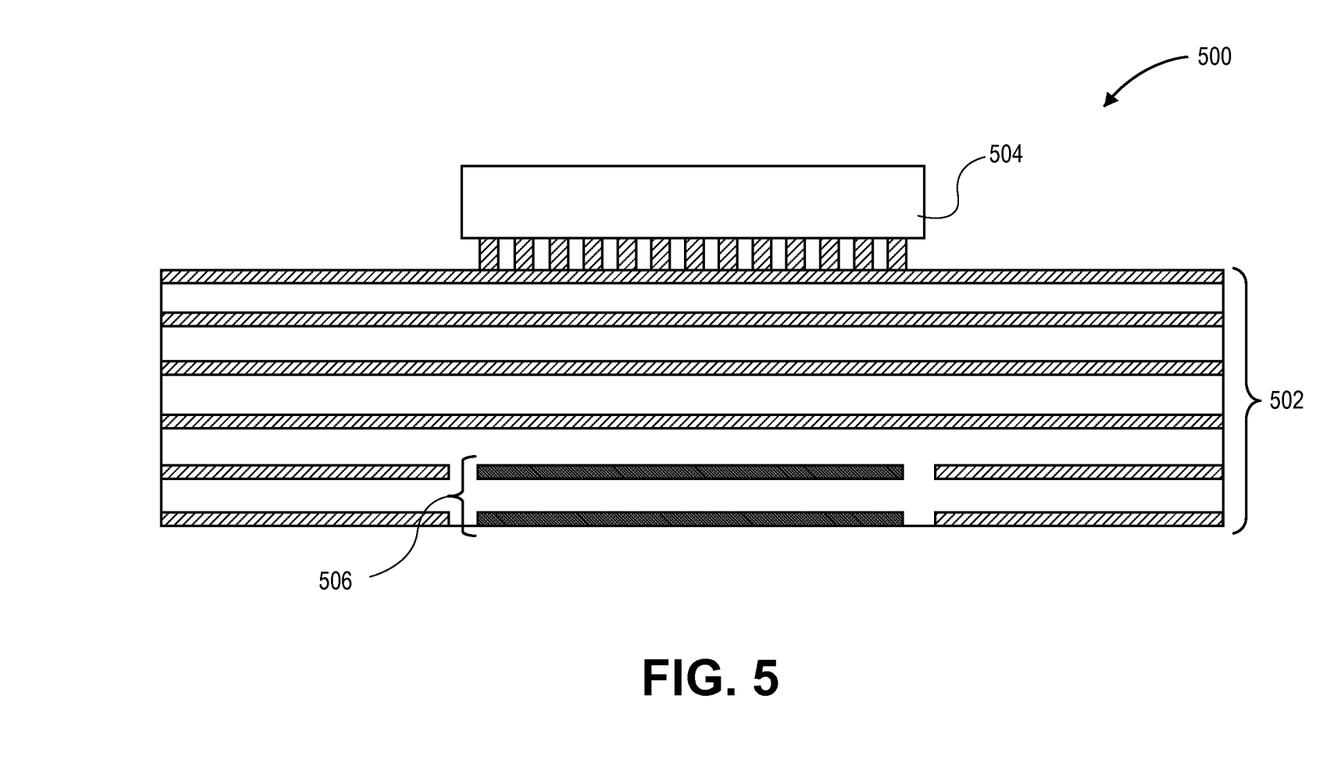
FIG. 5 illustrates a cross-sectional view of a semiconductor die packaged with an ACI formed in layers of a package substrate, in accordance with an embodiment of the present invention.

A variety of options may exist for packaging semiconductor dies with one or more ACIs having metal-density layer units of fractal geometry. For example, in a first embodiment, such an ACI is formed in layers of a package substrate. FIG. 5 illustrates a cross-sectional view of a semiconductor die packaged with an ACI formed in layers of a package substrate, in accordance with an embodiment of the present invention. Referring to FIG. 5, a semiconductor apparatus 500 includes a semiconductor package 502 with a central processing unit (CPU) 504 disposed thereon. An air core inductor 506 is included in the semiconductor package 502. In one embodiment, the air core inductor 506 is formed on a side of the semiconductor package 502 opposing the side of the semiconductor package 502 receiving the CPU 504. It is to be understood that additional layers of the package may be used for forming loops of the inductor structure, or for forming metal-density layer units there for, and that FIG. 5 is provided merely as a high level example of how an air core inductor may be included in a semiconductor package.

In the context of the above description of FIG. 5, in an embodiment, the one or more metal-density layer units is disposed between the stack of metal loops and the semiconductor die. In an alternative embodiment, however, the stack of metal loops is disposed between the one or more metal-density layer units and the semiconductor die. In an embodiment, the semiconductor package further includes a capacitor coupled to the inductor structure, and a load coupled to the capacitor. In one such embodiment, the inductor structure, the capacitor and the load form a portion of an integrated voltage regulator (IVR) for the semiconductor die.

As mentioned above, a semiconductor die packaged with one or more ACIs having metal-density layer units of fractal geometry may be housed in a variety of packaging options. One such option is housing in a coreless substrate formed by a BBUL process. BBUL is a processor packaging technology that is bumpless since it does not use the usual small solder bumps to attach the silicon die to the processor package wires. It has build-up layers since it is grown or built-up around the silicon die. Some semiconductor packages now use a coreless substrate, which does not include the thick resin core layer commonly found in conventional substrates. In an embodiment, as part of the BBUL process, electrically conductive vias and routing layers are formed above an active side of the semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA).

In an embodiment, a substrate is a coreless substrate since a panel is used to support packaging of a semiconductor die through to formation of an array of external conductive conducts. The panel is then removed to provide a coreless package for the semiconductor die. Accordingly, in an embodiment, the term "coreless" is used to mean that the support upon which the package was formed for housing a die is ultimately removed at the end of a build-up process. In a specific embodiment, a coreless substrate is one that does not include a thick core after completion of the fabrication process. As an example, a thick core may be one composed of a reinforced material such as is used in a motherboard and may include conductive vias therein. It is to be understood that die-bonding film may be retained or may be removed. In either case, inclusion or exclusion of a die-bonding film following removal of the panel provides a coreless substrate. Still further, the substrate may be considered a coreless substrate because it does not include a thick core such as a fiber reinforced glass epoxy resin.

A packaged semiconductor die may, in an embodiment, be a fully embedded and surrounded semiconductor die. As used in this disclosure, "fully embedded and surrounded" means that all surfaces of the semiconductor die are in contact with an encapsulating film (such as a dielectric layer) of substrate, or at least in contact with a material housed within the encapsulating film. Said another way, "fully embedded and surrounded" means that all exposed surfaces of the semiconductor die are in contact with the encapsulating film of a substrate.

A packaged semiconductor die may, in an embodiment, be a fully embedded semiconductor die. As used in this disclosure, "fully embedded" means that an active surface and the entire sidewalls of the semiconductor die are in contact with an encapsulating film (such as a dielectric layer) of a substrate, or at least in contact with a material housed within the encapsulating film. Said another way, "fully embedded" means that all exposed regions of an active surface and the exposed portions of the entire sidewalls of the semiconductor die are in contact with the encapsulating film of a substrate. However, in such cases, the semiconductor die is not "surrounded" since the backside of the semiconductor die is not in contact with an encapsulating film of the substrate or with a material housed within the encapsulating film. In a first embodiment, a back surface of the semiconductor die protrudes from the global planarity surface of the die side of a substrate. In a second embodiment, no surface of the semiconductor die protrudes from the global planarity surface of the die side of a substrate.

In contrast to the above definitions of "fully embedded and surrounded" and "fully embedded," a "partially embedded" die is a die having an entire surface, but only a portion of the sidewalls, in contact with an encapsulating film of a substrate (such as a coreless substrate), or at least in contact with a material housed within the encapsulating film. In further contrast, a "non-embedded" die is a die having at most one surface, and no portion of the sidewalls, in contact with an encapsulating film of a substrate (such as a coreless substrate), or in contact with a material housed within the encapsulating film.

In an embodiment, a substrate includes an encapsulant layer. In an embodiment, a semiconductor package for housing a semiconductor die packaged with one or more ACIs having metal-density layer units of fractal geometry includes a foundation substrate at the land side of the substrate. For example, where the semiconductor die is part of a hand-held device such as a smart phone embodiment or a hand-held reader embodiment, the foundation substrate may be a motherboard, an external shell such as the portion an individual touches during use, or both the motherboard and an external shell such as the portion an individual touches during use.

In another aspect, a semiconductor die packaged with one or more ACIs having metal-density layer units of fractal geometry is housed in a core of a substrate. The packaging processes may, in an embodiment, be performed on a carrier. A carrier, such as a panel, may be provided having a plurality of cavities disposed therein, each sized to receive a semiconductor die. During processing, identical structures may be mated in order to build a back-to-back apparatus for processing utility. Consequently, processing throughput is effectively doubled.

For example, a panel may include 1000 recesses on either side, allowing for fabrication of 2000 individual packages from a single panel. The panel may include an adhesion release layer and an adhesive binder. A cutting zone may be provided at each end of the apparatus for separation processing. A backside of a semiconductor die may be bonded to the panel with a die-bonding film. Encapsulating layers may be formed by a lamination process. In another embodiment, one or more encapsulation layers may be formed by spinning on and curing a dielectric upon a wafer-scale array of apparatuses.

In an embodiment, one or more of the above described semiconductor packages housing a semiconductor die are paired with other packages following the packaging process, e.g., the coupling of a packaged memory die with a package logic die. In an example, connections between two or more individually packaged die may be made post BBUL fabrication by using thermal compression bonding (TCB) processing. In another embodiment, more than one die is embedded in the same package. For example, in one embodiment, a packaged semiconductor die further includes a secondary stacked die. The first die may have one or more through-silicon vias disposed therein (TSV die). The second die may be electrically coupled to the TSV die through the one or more through-silicon vias. The apparatus may also include a coreless substrate. In one embodiment, all die are embedded in the coreless substrate.

Overall, in an embodiment, an advantage of a fractal shape it is the ability to maintain metal density trending, yet and render the formation of eddy currents difficult in such trending. It is to be understood that the applications of fractal shapes described above are not limited to only the domain of the density-metal shapes. Other areas of the ACI design may benefit from such a fractal shape concept as well. In an embodiment, use of a fractal shape somewhere within an ACI contributes to maintaining a trend of full passive device integration in electrical packages and reducing platform board development time and real-estate cost. One or more embodiments may be implemented in high volume manufacturing using air-core inductors in electrical packages. One or more embodiments of the present invention may be used to provide an integrated voltage regulator (IVRs) which may include inductors packaged with a semiconductor die, e.g., in a bumpless build-up layer (BBUL) package, in a cored substrate, or in a coreless substrate. Some embodiments include a semiconductor die packaged with one or more ACIs, on or more magnetic core inductors (MCIs), or one or more of both.

In an embodiment, a magnetic core inductor is an inductor that includes a magnetic core made of a ferromagnetic or ferrimagnetic material, such as iron or ferrite, to increase the inductance. In an embodiment, an air core inductor is an inductor that does not use a magnetic core made of a ferromagnetic material. The term refers to coils wound on plastic, ceramic, or other nonmagnetic forms, as well as those that actually have air inside the windings.

It is to be understood that embodiments of the present invention are not limited to those described in detail above. For example, metals other than copper may be used for fabrication, e.g., nickel, iron, etc. The fractal shape can be iterated by any fractional factor besides ¼ (e.g., ⅓, ⅝, etc). More loop stacks, besides two, are possible. ACIs may have 4, 6, or more such loop stacks. Usually, an even number of loop stacks and inputs are included, but embodiments are not limited thereto. Also, package inductors based on magnetic cores may also be added, and may take advantage of a fractal geometry. A patch-package using ACIs and an interposer may be used as well. Such an interposer may be used to, or involve the inclusion of, additional package layers. For example, a connection structure may include a silicon die+patch-package+interposer+metal bumps. Embodiments need not be limited to bumpless build-up layer (BBUL) packaging. In an embodiment, fractal vertical surface roughness is added to contribute to diminishing the effect of eddy currents. Such an approach may utilize an iterative fractal geometry in the top surface of the Koch island fractal described above. Other curves may be used for the iteration. Overall, it is to be understood that, generally, a fractal shape has a smaller area and also provides a more resistive path for the eddy currents.

Figure 6:
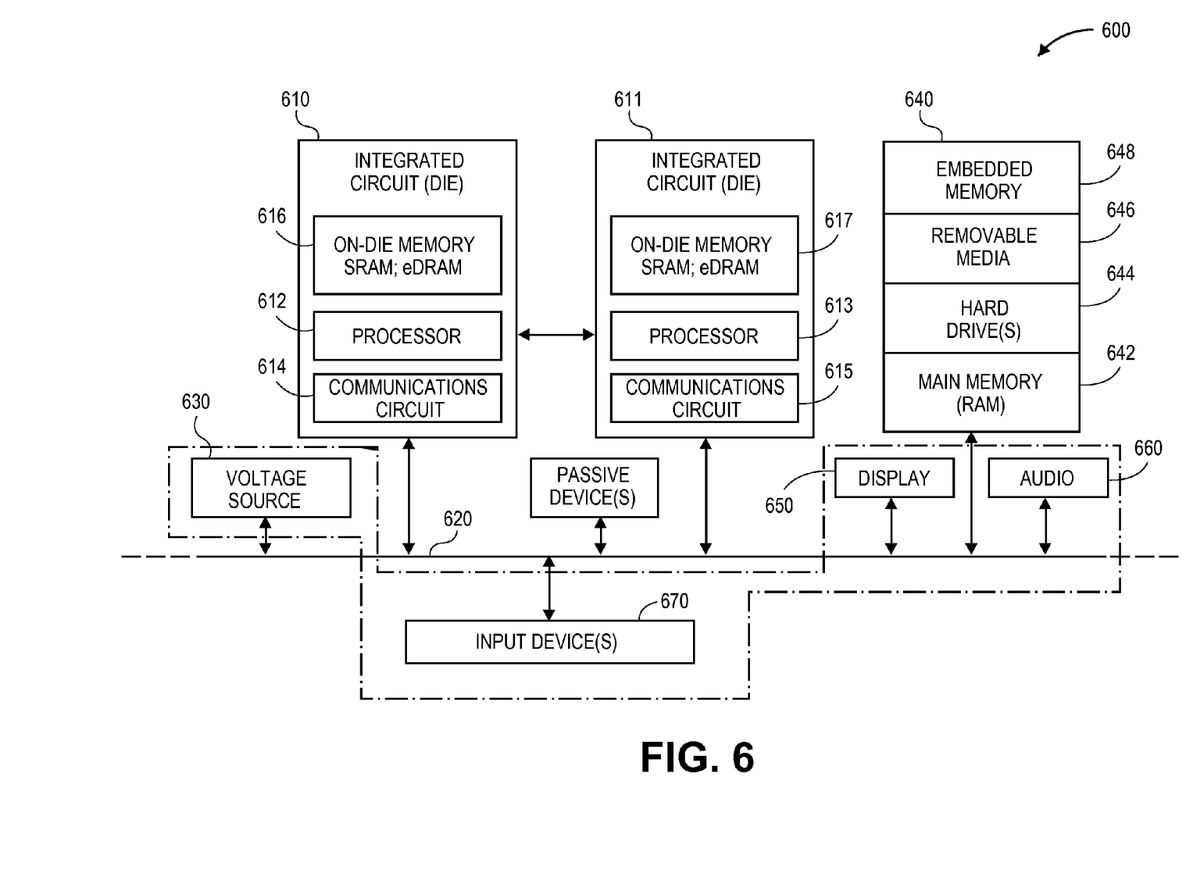
FIG. 6 is a schematic of a computer system, in accordance with an embodiment of the present invention.

FIG. 6 is a schematic of a computer system 600, in accordance with an embodiment of the present invention. The computer system 600 (also referred to as the electronic system 600) as depicted can embody a semiconductor die packaged with one or more ACIs having metal-density layer units of fractal geometry according to any of the several disclosed embodiments and their equivalents as set forth in this disclosure. The computer system 600 may be a mobile device such as a netbook computer. The computer system 600 may be a mobile device such as a wireless smart phone. The computer system 600 may be a desktop computer. The computer system 600 may be a hand-held reader. The computer system 600 may be a server system. The computer system 600 may be a supercomputer or high-performance computing system.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to the integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type. As used herein, the processor 612 may mean any type of circuit such as, but not limited to, a microprocessor, a microcontroller, a graphics processor, a digital signal processor, or another processor. In an embodiment, the processor 612 includes a semiconductor die packaged with one or more ACIs having metal-density layer units of fractal geometry, as disclosed herein. In an embodiment, SRAM embodiments are found in memory caches of the processor. Other types of circuits that can be included in the integrated circuit 610 are a custom circuit or an application-specific integrated circuit (ASIC), such as a communications circuit 614 for use in wireless devices such as cellular telephones, smart phones, pagers, portable computers, two-way radios, and similar electronic systems, or a communications circuit for servers. In an embodiment, the integrated circuit 610 includes on-die memory 616 such as static random-access memory (SRAM). In an embodiment, the integrated circuit 610 includes embedded on-die memory 616 such as embedded dynamic random-access memory (eDRAM).

In an embodiment, the integrated circuit 610 is complemented with a subsequent integrated circuit 611. Useful embodiments include a dual processor 613 and a dual communications circuit 615 and dual on-die memory 617 such as SRAM. In an embodiment, the dual integrated circuit 610 includes embedded on-die memory 617 such as eDRAM.

In an embodiment, the electronic system 600 also includes an external memory 640 that in turn may include one or more memory elements suitable to the particular application, such as a main memory 642 in the form of RAM, one or more hard drives 644, and/or one or more drives that handle removable media 646, such as diskettes, compact disks (CDs), digital variable disks (DVDs), flash memory drives, and other removable media known in the art. The external memory 640 may also be embedded memory 648 such as the first die in an embedded TSV die stack, according to an embodiment.

In an embodiment, the electronic system 600 also includes a display device 650, an audio output 660. In an embodiment, the electronic system 600 includes an input device such as a controller 670 that may be a keyboard, mouse, trackball, game controller, microphone, voice-recognition device, or any other input device that inputs information into the electronic system 600. In an embodiment, an input device 670 is a camera. In an embodiment, an input device 670 is a digital sound recorder. In an embodiment, an input device 670 is a camera and a digital sound recorder.

As shown herein, the integrated circuit 610 can be implemented in a number of different embodiments, including a semiconductor die packaged with one or more ACIs having metal-density layer units of fractal geometry according to any of the several disclosed embodiments and their equivalents, an electronic system, a computer system, one or more methods of fabricating an integrated circuit, and one or more methods of fabricating an electronic assembly that includes a semiconductor die packaged with one or more ACIs having metal-density layer units of fractal geometry according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with one or more ACIs having metal-density layer units of fractal geometry embodiments and their equivalents. A foundation substrate may be included, as represented by the dashed line of FIG. 6. Passive devices may also be included, as is also depicted in FIG. 6.

Embodiments of the present invention include semiconductor packages with ACIs having metal-density layer units of fractal geometry.

In an embodiment, an inductor structure includes a stack of metal loops. One or more input terminals is coupled to the stack of metal loops. One or more output terminals is coupled to the stack of metal loops. One or more metal-density layer units is disposed above and over the stack of metal loops. At least one of the metal-density layer units has a fractal geometry.

In one embodiment, the fractal geometry is a Koch Island fractal geometry.

In one embodiment, the Koch Island fractal geometry is a single iteration geometry based on a starting square geometry.

In one embodiment, the Koch Island fractal geometry is a multiple iteration geometry based on a starting square geometry.

In one embodiment, the inductor structure further includes a second stack of metal loops. One or more metal-density layer units is disposed above and over the second stack of metal loops. At least one of the metal-density layer units has a fractal geometry.

In one embodiment, four metal-density layer units each having a same fractal geometry are disposed above and over the stack of metal loops. Four metal-density layer units each having the same fractal geometry are disposed above and over the second stack of metal loops. The one or more input terminals is further coupled to the second stack of metal loops. The one or more output terminals is further coupled to the second stack of metal loops.

In one embodiment, none of the eight metal-density layer units is in contact with another one of the eight metal-density layer units.

In one embodiment, the inductor structure is an air core inductor.

In an embodiment, a semiconductor package includes a substrate and a semiconductor die coupled to the substrate. The semiconductor package also includes an inductor structure formed in the substrate and coupled to the semiconductor die. The inductor structure includes a stack of metal loops. One or more input terminals is coupled to the stack of metal loops. One or more output terminals is coupled to the stack of metal loops. One or more metal-density layer units is disposed above and over the stack of metal loops. At least one of the metal-density layer units has a fractal geometry.

In one embodiment, the substrate is a bumpless build-up layer (BBUL) substrate.

In one embodiment, the semiconductor die is housed in a core of the substrate.

In one embodiment, the substrate is a coreless substrate.

In one embodiment, the semiconductor package further includes a capacitor coupled to the inductor structure. A load is coupled to the capacitor. The inductor structure, the capacitor and the load form a portion of an integrated voltage regulator (IVR) for the semiconductor die.

In one embodiment, the fractal geometry is a Koch Island fractal geometry.

In one embodiment, the Koch Island fractal geometry is a single iteration geometry based on a starting square geometry.

In one embodiment, the Koch Island fractal geometry is a multiple iteration geometry based on a starting square geometry.

In one embodiment, the inductor structure further includes a second stack of metal loops and one or more metal-density layer units disposed above and over the second stack of metal loops. At least one of the metal-density layer units has a fractal geometry.

In one embodiment, for the inductor structure, four metal-density layer units each having a same fractal geometry are disposed above and over the stack of metal loops, four metal-density layer units each having the same fractal geometry are disposed above and over the second stack of metal loops, the one or more input terminals is further coupled to the second stack of metal loops, and the one or more output terminals is further coupled to the second stack of metal loops.

In one embodiment, for the inductor structure, none of the eight metal-density layer units is in contact with another one of the eight metal-density layer units.

In one embodiment, the inductor structure is an air core inductor.

In one embodiment, the one or more metal-density layer units is disposed between the stack of metal loops and the semiconductor die.

In one embodiment, the stack of metal loops is disposed between the one or more metal-density layer units and the semiconductor die.

In an embodiment, an inductor structure includes a stack of metal loops. One or more input terminals is coupled to the stack of metal loops. One or more output terminals is coupled to the stack of metal loops. One or more metal-density layer units is disposed above and over the stack of metal loops. At least one of the metal-density layer units has a geometry for reducing eddy current formation in the metal-density layer unit.

In one embodiment, the geometry is a Koch Island fractal geometry.

In one embodiment, the Koch Island fractal geometry is a single iteration geometry based on a starting square geometry.

In one embodiment, the Koch Island fractal geometry is a multiple iteration geometry based on a starting square geometry.

In one embodiment, the inductor structure further includes a second stack of metal loops; and one or more metal-density layer units disposed above and over the second stack of metal loops, at least one of the metal-density layer units having a geometry for reducing eddy current formation in the metal-density layer unit.

In one embodiment, four metal-density layer units each having a same geometry are disposed above and over the stack of metal loops, four metal-density layer units each having the same geometry are disposed above and over the second stack of metal loops, the one or more input terminals is further coupled to the second stack of metal loops, and the one or more output terminals is further coupled to the second stack of metal loops.

In one embodiment, none of the eight metal-density layer units is in contact with another one of the eight metal-density layer units.

In one embodiment, the inductor structure is an air core inductor.

What is claimed is:

1. A semiconductor package, comprising:
   a substrate;
   a semiconductor die coupled to the substrate; and
   an inductor structure formed in the substrate and coupled to the semiconductor die, the inductor structure comprising:
   a first stack of metal loops and a second stack of metal loops;
   one or more input terminals coupled to the first and second stacks of metal loops;
   one or more output terminals coupled to the first and second stacks of metal loops;
   a first set of four metal-density layer units disposed above and over the first stack of metal loops, each of the first set of four metal-density layer units having a same fractal geometry; and
   a second set of four metal-density layer units disposed above and over the second stack of metal loops, each of the second set of four metal-density layer units having the same fractal geometry.

2. The semiconductor package of claim 1, wherein the substrate is a bumpless build-up layer (BBUL) substrate.

3. The semiconductor package of claim 1, wherein the semiconductor die is housed in a core of the substrate.

4. The semiconductor package of claim 1, wherein the substrate is a coreless substrate.

5. The semiconductor package of claim 1, further comprising:
   a capacitor coupled to the inductor structure; and
   a load coupled to the capacitor, wherein the inductor structure, the capacitor and the load form a portion of an integrated voltage regulator (IVR) for the semiconductor die.

6. The semiconductor package of claim 1, wherein the fractal geometry is a Koch Island fractal geometry.

7. The semiconductor package of claim 6, wherein the Koch Island fractal geometry is a single iteration geometry based on a starting square geometry.

8. The semiconductor package of claim 6, wherein the Koch Island fractal geometry is a multiple iteration geometry based on a starting square geometry.

9. The semiconductor package of claim 1, wherein, for the inductor structure, none of the metal-density layer units of the first and second sets of four metal-density layer units is in contact with another one of the metal-density layer units of the first and second sets of four metal-density layer units.

10. The semiconductor package of claim 1, wherein the inductor structure is an air core inductor.

11. The semiconductor package of claim 1, wherein the first and second sets of four metal-density layer units is disposed between the first and second stack of metal loops, respectively, and the semiconductor die.

12. The semiconductor package of claim 1, wherein the first stack of metal loops is disposed between the first set of four metal-density layer units and the semiconductor die, and wherein the second stack of metal loops is disposed between the second set of four metal-density layer units and the semiconductor die.

* * * * *